United States Patent [19]
Dammel et al.

[11] Patent Number: 5,217,843
[45] Date of Patent: Jun. 8, 1993

[54] POSITIVE RADIATION-SENSITIVE MIXTURE, AND RADIATION-SENSITIVE RECORDING MATERIAL PRODUCED THEREFROM FOR HIGH-ENERGY RADIATION

[75] Inventors: Ralph Dammel, Mainz-Bretzenheim; Juergen Lingnau, Mainz-Laubenheim; Georg Pawlowski, Wiesbaden; Juergen Theis, Frankfurt am Main, all of Fed. Rep. of Germany

[73] Assignee: Hoechst Aktiengesellschaft, Frankfurt am Main, Fed. Rep. of Germany

[21] Appl. No.: 491,817

[22] Filed: Mar. 12, 1990

[30] Foreign Application Priority Data

Mar. 11, 1989 [DE] Fed. Rep. of Germany ....... 3907954

[51] Int. Cl.⁵ .................................... G03C 1/492
[52] U.S. Cl. .................................. 430/270; 430/306; 430/315; 430/326; 522/65
[58] Field of Search .............. 430/270, 326, 910, 306, 430/329, 269, 307, 308, 315, 318; 522/65

[56] References Cited

U.S. PATENT DOCUMENTS

| | | | |
|---|---|---|---|
| 3,615,455 | 10/1971 | Laridon et al. | 96/35.1 |
| 3,686,084 | 8/1972 | Rosenkranz et al. | 204/159.15 |
| 3,912,606 | 10/1975 | Pacifici et al. | 204/159.15 |
| 4,101,323 | 7/1978 | Buhr et al. | 96/35 |
| 4,243,957 | 2/1981 | Sander et al. | 430/270 |
| 4,247,611 | 1/1981 | Sander et al. | 430/286 |
| 4,289,845 | 9/1981 | Bowden et al. | 430/296 |
| 4,311,782 | 1/1982 | Buhr et al. | 430/270 |
| 4,398,001 | 8/1983 | Cheng et al. | 525/502 |
| 4,457,999 | 7/1984 | Stahlhofen | 430/270 |
| 4,458,000 | 7/1984 | Stahlhofen | 430/270 |
| 4,506,006 | 3/1985 | Ruckert | 430/270 |
| 4,678,737 | 7/1987 | Schneller et al. | 430/270 |
| 4,699,867 | 10/1987 | Schneller et al. | 430/270 |
| 4,752,552 | 6/1988 | Aoai | 430/270 |
| 4,816,375 | 3/1989 | Aoai | 430/270 |
| 4,820,607 | 4/1989 | Aoai | 430/270 |
| 4,840,867 | 6/1989 | Elsaesser et al. | 430/270 |
| 4,853,314 | 8/1989 | Ruckert et al. | 430/270 |

FOREIGN PATENT DOCUMENTS

| | | |
|---|---|---|
| 0232972 | 8/1987 | European Pat. Off. . |
| 1163324 | 9/1969 | United Kingdom . |

OTHER PUBLICATIONS

Taylor, "X-Ray Resist Trends," Solid State Technology, Jun. 1984, pp. 124–131.

Yamaoka et al., "Crosslinking of Polymers with Irradiating Rh, $L_a$ X Ray-Effect of Active Groups and a Heavy Atom on Crosslinking," Photographic Science and Engineering, vol. 23, No. 4, Jul./Aug. 1979, pp. 196–202.

Bowden et al., "A Sensitive Novolac-Based Positive Electron Resist," J. Electrochem. Soc.: Solid-State Science and Technology, Jun. 1981, pp. 1304–1312.

*Primary Examiner*—Jack P. Brammer
*Attorney, Agent, or Firm*—Foley & Lardner

[57] ABSTRACT

A positive radiation-sensitive mixture is disclosed which contains a compound which forms an acid under the action of high-energy radiation, and an acid-cleavable compound, wherein the compound which forms an acid contains aliphatically bound halogen (chlorine or bromine) and has a $pK_a$ value of less than about 12 or is a derivative of a compound having such a $pK_a$ value which can be converted into the free compound by acid catalysis. A positive recording material and a process for recording high-energy radiation using the material are also disclosed. The mixture, and in particular the recording material produced therefrom, has relatively high sensitivity and improved resolution and, in addition, does not exhibit image fogging after development.

16 Claims, No Drawings

POSITIVE RADIATION-SENSITIVE MIXTURE, AND RADIATION-SENSITIVE RECORDING MATERIAL PRODUCED THEREFROM FOR HIGH-ENERGY RADIATION

BACKGROUND OF THE INVENTION

The invention relates to a positive radiation-sensitive mixture containing a compound which forms an acid under the action of high-energy radiation, and an acid-cleavable compound.

In classical UV lithography, the resolution limit is determined by the wavelength of the radiation used. The constant decrease in dimensions in chip production therefore requires new lithographic techniques in the submicron region, electron or X-ray radiation being employed due to its extremely short wavelength. At the same time, it has been shown that resist materials which are suitable as electron beam resist can also be employed as X-ray resist, and vice versa.

Known resist materials for this application are acrylates and methacrylates (G.M. Taylor, Solid State Technology, 124 (1984)). In the case of these materials, it has been shown that sensitivity and structural resolution are usually contrary properties. If it is to be possible for higher sensitivities to be achieved, halogens are usually incorporated into the resist. In this case, fluorine and chlorine are usually employed in positive resists, whereas it is usually bromine and iodine, besides chlorine, which are employed in negative resists (T. Yamaoka et al., Phot. Sci. Eng. 23. 196 (1979)).

In general, negative resists exhibit higher sensitivity than positive resists, but, in contrast, cannot simultaneously—as stated above—have a high resolution in the submicron region. On the other hand, positive methacrylate-based resists achieve high resolution, but, with the exception of polymethacrylonitrile-based resists, are not stable to the plasma etching processes used for semiconductor structuring. In turn, however, the methacrylates are not sufficiently sensitive.

The polymers having the highest radiation sensitivity known to date to electron beams or X-rays are polyalkene sulfones, in particular polybutene 1-sulfone. The disadvantage of this class of compounds is, however, that they are less resistant to plasma etching processes; they are therefore suitable for mask production, but not for semiconductor fabrication using a mask made of this material. It has therefore been proposed to combine polyalkene sulfones with novolak resins, which, as is generally known, are resistant to plasma etching (M. J. Bowden et al., J. Electrochem. Soc. 128, 1304 (1981); U.S. Pat. No. 4,289,845). However, it became apparent that the two polymers are extremely incompatible with one another, thus impairing the resolution. An attempt to improve the compatibility by admixing further components also had to pay the price of loss in sensitivity (U.S. Pat. No. 4,398,001).

Photocatalytic systems are described in DE-A-2,718,254 (=U.S. Pat. No. 4,247,611) and DE-A-2,928,636 (=U.S. Pat. No. 4,311,782) for use with electron and X-ray radiation. In these positive systems, chlorinecontaining compounds, in particular of the substituted triazine type, are employed as compounds which form an acid under the action of actinic radiation. During structuring of these materials using electron or X-ray radiation, however, it was apparent that the edges of the resist structures are very negatively eroded after development (edge angle around 60° according to a photomicrograph using a scanning electron microscope (SEM)) and structures of less than about 2 $\mu$m consequently can no longer be resolved or imaged or, in some cases, are extremely frayed.

In DE-A-2,928,636, as in DE-A-2,610,842 (=U.S. Pat. No. 4,101,323), 2,3,4,5-tetrachloroanaline, inter alia, is mentioned as the chlorine-containing compound. In addition, DE-A-2,610,842 also discloses compounds which contain aliphatically bound bromine and one which carries aromatically bound bromine: 2,2',4,4',6,6'-hexabromodiphenylamine.

Chlorine- and bromine-containing compounds in photo-sensitive materials also include hexabromodimethyl sulfoxide in photographic materials (DE-B 1,572,089=GB-A 1,163,324), 2,2-dibromo-2-(phenylsulfonyl)acetophenone and related compounds as polymerization initiators (DE-A 1,817,540=U.S. Pat. No. 3,615,455), trichloromethyl-substituted benzophenones as polymerization initiators (DE-A-1,949,010 =U.S. Pat. No. 3,686,084), haloalkylbenzoxazoles, -benzimidazoles and -benzothiazoles as polymerization initiators (U.S. Pat. No. 3,912,606) and side group-halogenated acetophenones as photocatalysts for acid-curable surface coatings (DE-A 2,317,846).

A number of these compounds result in significant losses in resolution. Without exception, undesired image fogging occurs, which excludes use of such compounds in practice as photolytic acid donors in X-ray lithography. The chlorine compounds in particular exhibit inadequate resolution. By contrast, the compounds mentioned containing aromatically bound bromine cause undesired image fogging. In general, however, this image fogging is attributable to inadequate solubility of the initiator compounds in aqueous alkaline developers.

It has therefore been proposed, in accordance with the earlier German Patent Application P 38 21 585.3, to use as initiator compounds, compounds containing aromatically bound chlorine or bromine which have a $pK_a$ value of less than 12. Although the compounds mentioned exhibit good sensitivities on irradiation with synchrotron radiation, the sensitivities which can be achieved using them on irradiation with UV radiation are, however, relatively low.

SUMMARY OF THE INVENTION

Accordingly, it is an object of the present invention to provide a positive radiation-sensitive mixture which has high sensitivity to high-energy radiation, such as electron or X-ray radiation, and especially to short-wave UV radiation.

Another object of the present invention is to provide a positive radiation-sensitive mixture which has good resolution, does not exhibit image fogging after development with an aqueous alkaline developer and has adequate resistance to plasma etching.

Yet another object of the present invention is to provide an improved positive recording material.

A further object of the present invention is to provide an improved process for recording high-energy radiation.

In accomplishing the foregoing objectives, there has been provided, in accordance with one aspect of the present invention, a positive radiation-sensitive mixture which comprises a compound which forms an acid under the action of high-energy radiation, and an acid-cleavable compound, wherein the compound which forms an acid contains at least one aliphatically bound halogen atom and has a p$K_a$ value of less than about 12, or is a derivative of such a compound having said p$K_a$ value which is capable of being converted into the free compound by acid catalysis.

In accordance with another aspect of the present invention there is provided a positive recording material which comprises a substrate and a positive radiation-sensitive coating comprising a radiation-sensitive mixture as described above.

In accordance with still another aspect of the present invention, there is provided a process for recording high-energy radiation which comprises the steps of applying a coating comprising the foregoing radiation-sensitive mixture to a substrate to form a positive recording material, drying the material, irradiating the material imagewise with high-energy radiation, and developing the resultant image by removing the non-irradiated areas of the coating using an aqueous alkaline developer.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF THE PREFERRED EMBODIMENTS

It was entirely surprising that compounds or initiators containing an aliphatically bound chlorine or bromine atom and having a p$K_a$ value of less than about 12, or derivatives thereof, have these advantageous properties since the compounds containing aliphatically bound halogen, in particular bromine, and disclosed in the prior art (DE-A-2,610,842) had not proven suitable.

Of the acid-forming initiators and acid-cleavable derivatives of these compounds containing aliphatically bound chlorine or bromine, those are preferred which have a p$K_a$ value in the range 6 to 10, or derivatives of these compounds.

The p$K_a$ value of chemical compounds can be determined by customary methods, but theoretical calculation using the "CAMEO" program and the like is also possible.

In general, the initiator compounds comprise a group containing aliphatically bound chlorine or bromine and a functional group which determines the p$K_a$ value necessary.

Suitable functional groups which give such a p$K_a$ value are, in particular: phenolic OH groups, aliphatic OH groups with strongly electronattracting substituents in the vicinity, aromatic SH groups, aliphatic or aromatic sulfonamide groups, aliphatic or aromatic imide groups, N-acyl-substituted carbamate groups or carbamide groups, nitro-substituted alkyl groups or other CH-acidic functional groups, for example those with carbonyl, cyano or carboxylate groups in the vicinity. At least one of these groups is present per compound.

Suitable substituents for the N-acyl-substituted carbamate or carbamide groups are alkyl or aryl groups, in particular those having 2 to 6 carbon atoms. ($C_2$-$C_3$)alkyl groups and phenyl groups, which may in each case themselves be substituted, in particular by hydroxyl, are particularly preferred. In these cases, the hydroxyl group is localized in particular in the $\omega$-position as a substituent of an alkyl radical and in particular in the 4-position as a substituent of a phenyl radical.

In a particular variant, the optionally OH—substituted aryl groups occur as substituents of an N-acyl-substituted carbamate, while the optionally OH-substituted alkyl groups occur as substituents, in particular, of an N-acyl-substituted carbamide.

CH-acidic functional groups which may be mentioned in particular are $\beta$-diketone or $\beta$-ketoester groups. In the case of the esters, alkyl esters, in particular the methyl or ethyl esters, are preferred. The $\beta$-diketone units may be substituted in an $\alpha$-position relative to the carbonyl groups, in particular by phenyl or methyl.

Of the functional groups mentioned which determine the p$K_a$ value necessary, in particular one is present per initiator molecule. However, in the case of N-acyl-substituted carbamates, a hydroxyphenyl group may additionally be present in the molecule, in particular as a substituent of the nitrogen atom.

Preferred functional groups which are able to produce the p$K_a$ value necessary are phenolic OH groups, imide groups, N-acyl-substituted carbamate or carbamide groups or CH-acidic functional groups.

Imide groups, N-acyl-substituted carbamate or carbamide groups or CH-acidic functional groups are particularly preferred. In a particular embodiment, the group causing the alkali solubility may also be protected by an acid-labile group. An example which may be mentioned is the acetalization of the phenolic OH function by the addition reaction of a vinyl ether. In these cases, removal of the protective group occurs as a consequence of the exposure step, and the compound modified in this way becomes alkali-soluble.

In general, however, protective groups of any type which cause esterification of hydroxyl groups can be used. Such protective groups are described by Theodora W. Greene, Protective Groups in Organic Synthesis, John Wiley & Sons, 1981, (87/K 754).

The halogen-containing functional group can contain the bromine or chlorine required in any aliphatically bound form. The halogen here may be bound to an $sp^3$-, $sp^2$- or sp-hybridized carbon atom. Halogen bound to an $sp^3$-hybridized carbon atom is preferred.

Due to their thermal stability, compounds in which elimination of hydrogen halide is only possible with difficulty or not at all, due to the molecular structure, are preferred. Compounds which may be mentioned are those which do not have hydrogen atoms in the $\alpha$-position relative to the halogen substituents, such as, for example, trichloromethylcarbonyl- or 2,2,2-trichloro-1,1-difluoroethyl- or 2,2,2-trichloro-tert.butyl-substituted or correspondingly lower halogenated functional groups.

The trihalomethylcarbonyl, trihalomethyl, monohalomethylcarbonyl, monohalomethyl and 2,2,2-trihalo-tert.butyl groups are preferred. The trichloromethylcarbonyl groups, monobromomethylcarbonyl groups and trichloromethyl groups are particularly preferred.

In case of a CH-acidic compound, the halogen may also be bound to the carbon atom to which the acidic H atom is attached. This applies, in particular, to the halogen chlorine and in a $\beta$-ketoester. Likewise, the halogen, in particular as a trihalomethyl or monohalomethyl group, can be bound to the carbonyl group in the $\beta$-diketone or $\beta$-ketoester.

Alternatively, functional groups in which elimination of hydrogen halide is not possible due to the steric arrangement are also suitable, for example in gammexyl (all-trans-hexachlorocyclohexyl), i.e., the α-carbon atom has no hydrogen atoms in the trans-position to the halogen atom.

In addition to these aliphatically bound halogen atoms, aromatically bound halogen atoms may also be present in the molecule. Molecular structures which are additionally chlorinated or brominated in the o,o-position to a phenolic OH group have proven particularly suitable.

In the initiators present in the radiation-sensitive mixture according to the invention, the halogen-containing functional groups are preferably linked by a single bond to the functional groups by which the $pK_a$ value of the compound is determined.

However, this is not applicable to polymeric initiator compounds, in particular homopolymers or copolymers containing vinyl phenol units.

In the case of copolymers, the halogen, in particular chlorine, is bound via the comonomer. Vinyl chlorides, vinyl bromides, allyl halides, halogen-containing vinyl esters and halogen-containing esters of acrylic or methacrylic acid may preferably be mentioned.

In the case of homopolymers, individual hydroxyl groups, in particular, of the hydroxyphenol units form esters with trihalomethylcarbonyl groups. Every 2nd to 5th hydroxyphenol unit in the polymer is preferably reacted in this way.

In both homopolymers and copolymers, chlorine or bromine may, in addition to or instead of the above substituents, be present in the o,o-position relative to the phenol group. However, this embodiment is not preferred.

The polymers mentioned each contain on average, in particular, one halogen-containing group and one group capable of modifying the $pK_a$ value per unit.

The compounds have a molecular weight in the range from about 2,000 to 100,000.

The initiators present in the radiation-sensitive mixture according to the invention may be used alone or in combination with other initiators of the class mentioned. However, combinations with other initiators are also possible.

These include diazonium, phosphonium, sulfonium and iodonium salts, halogen compounds, diazo-o-quinone sulfochlorides and -esters, and organometallic/organohalogen combinations (cf. DE-A-3,601,264).

The halogen compounds include, in particular, triazine derivatives, which are known from U.S. Pat. Nos. 3,515,552, 3,536,489 and 3,779,778, and DE-C-2,718,259, 3,337,024, 3,333,450, 2,306,248, 2,243,621 and 1,298,414.

It is also possible to use oxazoles, oxadiazoles, thiazole or 2-pyrones containing trichloromethyl or tribromomethyl groups in a mixture with the initiators mentioned (DE-A-3,021,599, 3,021,590, 2,851,472, 2,949,396 and EP-A-0,135,348 and 0,135,863).

Besides these, the potential coinitiator compounds also include aromatic compounds containing a ring-bound halogen, preferably bromine. Such compounds are known from DE-A-2,610,842 and the earlier German Patent Applications P 37 30 784.3 and 38 21 585.3.

A representative of a combination with a thiazole which may be mentioned is 2-benzoylmethylene-naphtho[1,2-a]thiazole (DE-A-2,851,641 and DE-A-2,934,758).

α-Halocarboxamides (DE-A-2,718,200) or tribromomethyl phenyl sulfones (DE-A-3,503,113), which may be sensitized, for example, by means of benzophenone, benzil or Michler's ketone, are also available as coinitiators in an initiator combination.

The coinitiators mentioned may be present with the initiators containing aliphatically bound halogen in any mixing ratio in the radiation-sensitive mixture according to the invention, but with the proviso that the initiator combination has, as a mixture, a $pK_a$ value of less than about 12, in particular of 6 to 10.

The total content of initiator compounds in the radiation-sensitive mixture according to the invention is in general about 0.5 to 50% by weight, preferably 2 to 25% by weight, in each case based on the total weight of the coating.

If the initiator is present in polymeric form, in particular as part of the binder, the upper limit is represented by the contents indicated under the corresponding polymeric binders. The respective content of the initiator or of the molecule groups in the polymer responsible for initiation can be calculated from the mixing ratios of the monomeric starting components.

The following classes of compounds, above all, have proven successful as the acid-cleavable material in the radiation-sensitive mixture according to the invention:

a) those containing at least one orthocarboxylate and/or carboxyamide acetal group, the compounds also having a polymeric character and it being possible for the groups mentioned to occur as linking elements in the main chain or as lateral substituents, b) oligomeric or polymeric compounds containing recurring acetal and/or ketal groups in the main chain, c) compounds containing at least one enol ether or N-acyliminocarbonate group, d) cyclic acetals or ketals of β-ketoesters or -amides, e) compounds containing silyl ether groups, f) compounds containing silyl enolether groups, g) monoacetals or monoketals whose aldehyde or ketone components have a solubility in the developer between about 0.1 and 100 g/l, h) ethers based on the tertiary alcohols and i) carboxylates and carbonates of tertiary, allylic or benzylic alcohols.

As components of radiation-sensitive mixtures, acid cleavable compounds of type a) are described in detail in EP-A-0,022,571 and DE-A-2,610,842; mixtures which contain compounds of type b) are described in DE-C-2,306,248 and DE-C-2,718,254; compounds of type c) are mentioned in EP-A-0,006,626 and 0,006,627; compounds of type d) are presented in EP-A-0,202,196; compounds belonging to type e) are presented in DE-A-3,544,165 and DE-A-3,601,264; compounds of type f) are found in the Patent Application P 3,730,783.5, (corresponding to U.S. application Ser. No. 07/243,819) whereas compounds of type g) are treated in the Patent Applications P 3,730,785.1 and P 3,730,787.8, (corresponding to U.S. applications Ser. Nos. 07/243,818 and 07/243,792) filed simultaneously with U.S. Ser. No. 07/243,819. Compounds of type h) are described, for example, in U.S. Pat. No. 4,603,101, and compounds of type i), for example, in U.S. Pat. No. 4,491,628 and by J. M. Fréchet et al., J. Imaging Sci. 30, 59–64 (1986).

It is also possible to use mixtures of the acid-cleavable materials mentioned. However, an acid-cleavable material which belongs to one of the above-mentioned types is preferred. Of the materials, those are particularly preferred which belong to types a), b), g) and i), especially those having acid-cleavable C-O-C groups. Under type b), the polymeric acetals should be particularly emphasized; of the acid-cleavable materials of type g), particularly those whose aldehyde or ketone component has a boiling point higher than about 150° C., preferably higher than 200° C. are preferred.

The content of acid-cleavable material in the radiation-sensitive mixture according to the invention should be about 1 to 50% by weight, preferably 5 to 25% by weight, in each case relative to the total weight of the coating.

The radiation-sensitive mixture according to the invention furthermore contains a binder which is insoluble in water, but soluble or at least swellable, in organic solvents and aqueous alkali. Such binders include, above all, phenolic resins of the novolak type. Phenol-formaldehyde resins, cresolformaldehyde resins, the cocondensates and mixtures thereof are mentioned.

In addition, it is also possible to employ vinyl polymers, such as poly(vinyl acetals), polymethacrylates, polyacrylates, poly(vinyl ethers), polyvinylpyrrolidones and styrene polymers, in each case optionally modified by comonomers, which may be used alone or mixed with others.

The following may be mentioned in particular: polymers of styrene with alkenylsulfonylaminocarbonyloxy or cycloalkenylsulfonylaminocarbonyloxy units (EP-A-0,184,804), polymers of acrylic acid, methacrylic acid, maleic acid, itaconic acid, etc. containing lateral, crosslinking —$CH_2OR$ groups (EP-A-0,184,044), polymers made of vinyl monomers and alkenylphenol units (EP-A-0,153,682), polyvinylphenols as novolak substitute (DE-C-2,322,230), polymeric binders containing lateral, phenolic hydroxyl groups (EP-A-0,212,439 and 0,212,440), styrene-maleic anhydride copolymers (DE-A-3,130,987), polymers made from unsaturated (thio)-phosphinic acid iso(thio)cyanates with a polymer containing active hydrogen (DE-A-3,615,612 and 3,615,613), polymers containing vinyl acetate, vinyl alcohol and vinyl acetal units (EP-A-0,216,083), poly(-vinyl acetals) containing units of hydroxy aldehydes (DE-A-3,644,162) and copolymers made from maleimide and styrene or 3,5-disubstituted poly-4-hydroxystyrenes.

The amount of binder is generally about 1 to 90, in particular 5 to 90% by weight, preferably 50 to 90% by weight, relative to the total weight of the radiation-sensitive mixture.

The water-insoluble, but alkali-soluble binders mentioned may be omitted, if desired, when polymeric alkali-soluble initiators are used. In particular, the above-described brominated or chlorinated polystyrenes or polyvinylphenols are suitable for this purpose. As a consequence, the content of the polymeric initiator may also extend beyond the range described for the initiators. In particular, contents of greater than about 50% by weight and up to 100% by weight, less the content of the acid-cleavable compound, are claimed.

In addition, it is also possible to prepare the binder by condensation of a chlorine- or bromine-containing aromatic compound present in the mixture according to the invention as co-initiator with a starting monomer which is known for the preparation of customary binders. The prerequisite is that the acid-forming chlorine- or bromine-containing material contains groups which are capable of condensation or polymerization.

As far as the monomeric components of customary binders are concerned, phenols and cresols, in particular m-cresol, are primarily preferred for this condensation. The condensation is preferably carried out using approximately equimolar amounts.

Besides this condensation of the chlorine- or bromine-containing initiator with monomeric components of known binders to form a polymeric initiator which simultaneously acts as binder, simple mixing is also possible, but in this case of a polymeric initiator and customary binders. In particular, bromine-containing styrene derivatives are mixed with novolak resins, preferably in approximately equimolar amounts.

Furthermore, dyes, pigments, plasticizers, wetting agents and flow control agents, but also polyglycols and cellulose ethers, for example ethylcellulose, may optionally be added to the radiation-sensitive mixtures according to the invention in order to improve specific required properties, such as flexibility, adhesion and gloss.

The radiation-sensitive mixture according to the invention is preferably dissolved in solvents, such as ethylene glycol, glycol ethers, such as glycol monomethyl ether, glycol dimethyl ether, glycol monoethyl ether or propylene glycol monoalkyl ethers, in particular propylene glycol methyl ether; aliphatic esters, such as ethyl acetate, hydroxyethyl acetate, alkoxyethyl acetate, n-butyl acetate, propylene glycol monoalkyl ether acetate, in particular propylene glycol methyl ether acetate, or amyl acetate; ethers, such as dioxane, ketones, such as methyl ethyl ketone, methyl isobutyl ketone, cyclopentanone and cyclohexanone; dimethylformamide, dimethylacetamide, hexamethylphosphoricamide, N-methylpyrrolidone, butyrolactone, tetrahydrofuran, or in mixtures thereof. Glycol ethers, aliphatic esters and ketones are particularly preferred.

The solutions produced using the components of the radiation-sensitive mixture generally have a solids content of about 5 to 60% by weight, preferably up to 50% by weight.

A radiation-sensitive recording material, comprising a substrate and the radiation-sensitive mixture applied thereto, is furthermore claimed according to the invention.

Suitable substrates are all materials from which capacitors, semiconductors, multilayered printed circuits or integrated circuits are made or from which they can be produced. In particular, surfaces which are made of thermally oxidized and/or aluminum-coated silicon material and may optionally also be doped may be mentioned, including all other substrates which are customary in semiconductor technology, such as, for example, silicon nitride, gallium arsenide and indium phosphide. In addition, the substrates which are known from the manufacture of liquid-crystal displays, such as glass and indium/tin oxide; furthermore metal plates and foils, for example made of aluminum, copper or zinc; bimetallic and trimetallic foils, but also electrically nonconductive foils which are vapour-coated with metals, optionally aluminum-coated $SiO_2$ materials and paper, are suitable. These substrates may be subjected to thermal pretreatment, may be superficially roughened, etched or treated with chemicals in order to improve desired properties, such as, for example, to increase hydrophilicity.

In a particular embodiment, the radiation-sensitive mixture can contain an adhesion promoter for better adhesion, either in the resist itself or between the resist and the substrate. In the case of silicon or silicon dioxide substrates, adhesion promoters of the aminosilane type, such as, for example, 3-aminopropyltriethoxysilane or hexamethyldisilazane, are suitable for this purpose.

Examples of carriers which can be used for the production of photomechanical recording layers, such as printing forms for letterpress printing, planographic printing, screen printing and rotogravure printing, and for the production of relief copies, are aluminum plates, optionally anodically oxidized, grained and/or silicated aluminum plates, zinc plates, steel plates, which have optionally been chrome-plated, and plastic films or paper.

The recording material according to the invention is irradiated imagewise with high-energy radiation sources; electron or X-ray radiation is preferred.

The coating thickness varies with its field of use and is between about 0.1 and 100 μm, in particular between 1 and 10 μm.

The invention furthermore relates to a process for the production of a radiation-sensitive recording material. The radiation-sensitive mixture can be applied to the substrate by spraying, flow coating, roller application, spin coating or dipping. The solvent is then removed by evaporation, leaving the radiation-sensitive coating on the surface of the substrate. The removal of the solvent can be accelerated, if necessary, by heating the coating to temperatures of up to 150° C. However, it is also possible initially to apply the mixture in the above-mentioned manner to an intermediate carrier, from which it is transferred onto the final carrier material under pressure at elevated temperature. The intermediate carriers used may, in principle, be any materials mentioned as carrier materials. The coating is subsequently irradiated imagewise. High-energy radiation, such as X-ray or electron radiation, for example synchrotron radiation having doses from about 20 to 200 mJ/cm$^2$ or radiation from an electron-beam writer, is preferred. Irradiation with short-wave UV light is particularly preferred. In the radiation-sensitive coating, an image pattern is subsequently bared by development by treating the coating with a developer solution which dissolves or removes the irradiated regions of the material.

The developers used are solutions of alkaline reagents, such as, for example, silicates, metasilicates, hydroxides, hydrogen phosphates, dihydrogen phosphates, carbonates or hydrogen carbonates, in particular of alkali metal ions or ammonium ions, but also ammonia and organic ammonium bases and the like. The content of these substances in the developer solution is generally about 0.1 to 15% by weight, preferably 0.5 to 5% by weight, relative to the weight of the developer solution.

In order to increase the resistance to mechanical and chemical influences, in particular to etching media, the developed coatings can be heated for some time, for example about 5 to 40 minutes, at elevated temperature, for example above 100° C., it being possible for this action to be further supported by exposure with UV radiation.

The preparation of the aromatic chlorine- or bromine-containing compounds present in the radiation-sensitive mixture according to the invention, some of which are new, is illustrated with reference to the examples below:

PREPARATION EXAMPLE 1

O-2,2,2-trichloroethyl N-(4-hydroxyphenyl)carbamate 4.3 g (0.02 mol) of 2,2,2-trichloroethyl chloroformate are dissolved in 20 ml of DMF (dimethyl formamide) and added dropwise to a solution of 10.9 g (0.1 mol) of 4-hydroxyaniline in 100 ml of DMF. After the mixture has been stirred for a further hour at room temperature, it is poured into ice water, acidified and filtered with suction, and the material filtered off is washed with water. The product is recrystallized from toluene using activated charcoal. 2.3 g of a substance of melting point 134° C. are obtained; $^1$H NMR: —NH— 9.17 ppm (s, 1H), —CH$_2$ 4.9 ppm (s, 2H), —OH (+H$_2$O) 3.31 ppm (s), aromatics 6.67 ppm (d, 2H) 7.27 ppm (d, 2H).

PREPARATION EXAMPLE 2

N-trichloroacetyl-N'-3-hydroxypropylurea 3.75 g of 3-aminopropanol are dissolved in a mixture of 10 g of water and 10 g of acetone. 9.4 g of trichloroacetyl isocyanate are subsequently added dropwise. After a slightly exothermic reaction, the mixture is stirred for 1 hour at room temperature, then refluxed for 2.5 hours. Concentration in a rotary evaporator gives 7.7 g of an oily phase, which is taken up in acetone and subjected to column chromatography on silica gel using cyclohexane/ethyl acetate (1:1) as eluent.

4.3 g of an oil are obtained; $^1$H—NMR: —NH— 7.7 ppm (broad), —CH$_2$— 3.80 (t, 2H), 3.52 (q, 2H), 1.84 ppm (p, 2H), —OH 2.64 ppm (s, 1H).

PREPARATION EXAMPLE 3

O-phenyl N-trichloroacetylcarbamate 4.7 g (0.05 mol) of phenol are dissolved in a mixture of 10 g of water and 10 g of acetone. 9.4 g (0.05 mol) of trichloroacetyl isocyanate are subsequently added dropwise over the course of 30 minutes. The mixture is stirred at room temperature for 30 minutes and under reflux for 2.5 hours. The solvent mixture is evaporated in a rotary evaporator, and the solid obtained is recrystallized from DMSO (dimethyl sulfoxide).

6.1 g of a substance of melting point 148° C. are obtained; $^1$H NMR: signals at about 8 ppm.

PREPARATION EXAMPLE 4

Ethyl 4-bromo-3-oxobutyrate 32.5 g (0.25 mol) of ethyl acetoacetate are dissolved in 64 ml of glacial acetic acid. 40 g (0.25 mol) of bromine are added dropwise to the cooled solution. The mixture is left to stand overnight and then poured into cold water. The oil obtained is washed with water, dried and distilled in a glass filter pump vacuum.

The fine distillation is carried out at 0.08 mmHg, where the boiling point is 53° C. $^1$H NMR: —CH$_3$ 1.28 ppm (t, 3H), —CH$_2$— 4.20 ppm (ester, q, 2H), and signals at 12.0 ppm, 3.70 ppm, 4.05 ppm and 4.16 ppm.

PREPARATION EXAMPLE 5

Ethyl 2-chloro-3-oxo-butyrate 32.5 g 0.25 mol) of ethyl acetoacetate are dissolved in 64 ml of methylene chloride. 33.74 g (0.25 mol) of sulfuryl chloride are added dropwise to the solution, and the mixture is then (when the evolution of gas is complete) heated at a gentle boil for 1 hour. After the methylene chloride has been removed by distillation, the residue is distilled at 86°-92° C./12 mmHg. 38.8 g of substance are obtained, $^1$H NMR: —CH$_3$ 1.31 ppm (t, 3H), —CH$_2$— (ester) 4.28 ppm (q, 2H), —CH$_3$ (acetyl) 2.38 ppm (s, 3H), —CHCl— 4.76 ppm (s, 1H).

PREPARATION EXAMPLE 6

4-Trichloroacetylphenol 13.86 g of AlCl$_3$ and 10.7 ml of chlorobenzene are introduced into a flask at 5° C. A solution of 5.06 g of phenol in 5.4 ml of chlorobenzene is added dropwise at 5° C., and 8 ml of trichloroacetonitrile are subsequently added dropwise, also at this temperature. The mixture is warmed to 60° C. while passing HCl into the flask, and stirring is continued until a clear solution has been produced. The mixture is subsequently stirred at 60° C. for a further 65 hours, the product is poured onto ice and extracted with ether, and the ether phase is washed, dried using sodium sulfate and evaporated.

Vacuum distillation at 0.1 mm gives a boiling point of 140° C.; $^1$H NMR: —OH 6.2 ppm (broad, s), aromatics: 6.95 ppm (d, 2H) and 8.24 ppm (d, 2H).

PREPARATION EXAMPLE 7

1,1,1-Trichloroacetylacetone a) Precursor: 1,1,1-trichloro-2-amino-2-penten-4-one (by the method of M. Coenen et al, J. Prakt. Chem. (4) 27, 239 (1965)) 50 g (0.5 mol) of acetylacetone and 70 g (0.5 mol) of trichloroacetonitrile are dissolved in 200 ml of methanol. 100 ml of saturated sodium acetate solution are added dropwise at 20°–30° C. During this addition, the reaction mixture becomes yellow and the temperature increases to 60° C. The mixture is stirred for two hours and then stirred into 2 l of water, and the oily product which deposits gradually becomes solid. It is filtered off with suction, dried and recrystallized from hexane. 85 g of a substance of melting point 67° C. are obtained; $^1$H NMR: —CH$_3$ 2.19 ppm (s), —CH=5.9 ppm (t, 1H), —NH$_2$ 7–8.5 ppm (broad, 2H).

b) 1,1,1-Trichloroacetylacetone (by the method of C. Ringel, R. Mayer, J. Prakt. Chem. (4), 26, 333 (1964)) 50 g of 1,1,1-trichloro-2-amino-2-penten-4-one are stirred at room temperature with 100 ml of concentrated hydrochloric acid, during which ammonium chloride and the target compound deposit with slight warming. After two hours, 80 ml of water are added. The oily layer is separated off and taken up in 150 ml of ether, the ether solution is dried over sodium sulfate and evaporated on a rotary evaporator, and the residue is distilled at 0.15mm Hg and 46° C. 31 g of an oil are obtained; $^1$H NMR: —CH$_3$ 2.19 ppm (s, 3H), —CH=6.11 ppm (s, 1H), —OH 13.6 ppm (broad, 1H). The compound is present to about 94% in the enol form (in CDCl$_3$ at room temperature), and the keto form exhibits signals at: —CH$_3$, 2.34 ppm and —CH$_2$— 4.10 ppm (ratio 3:2).

PREPARATION EXAMPLE 8

ω,ω,ω-Trichlorobenzoylacetone a) Precursor: 1,1,1-Trichloro-2-amino-4-phenyl-4-oxo-2-butene (by the method of M. Coenen et al, J. Prakt. Chemie (4) 27. 248 (1965)) The compound is prepared analogously to the preparation of the precursor from preparation example 7, with the difference that the acetylacetone is replaced by benzoylacetone. A product having a melting point of 104° C. is obtained. (Lit.: 102°–103° C.). $^1$H NMR: —CH=6.63 ppm (t, 1H), aromatics and —NH$_2$ 7–8.2 ppm (7H).

b) ω,ω,ω-Trichlorobenzoylacetone (by the method of C. Ringel, R. Mayer, J. Prakt. Chem. (4), 26, 333 (1964)) The procedure followed is analogous to Preparation Example 7, with the difference that a benzoyl- substituted compound is employed in place of the acetyl-substituted compound. An oil is obtained having a boiling point of 112° C./0.2 mm Hg(Lit.: 102° C./0.09 mmHg) $^1$H NMR: —CH=(enol form) 6.80 ppm (s, 1H), —OH 14.25 ppm (s, 1H), aromatics 7.3–8.0 ppm (5H). The keto form is present to the extent of about 15% in CDCl$_3$ at room temperature and gives a —CH$_2$— at 7.25 ppm (s).

PREPARATION EXAMPLE 9

Methyl 4,4,4-trichloroacetoacetate a) Precursor: Methyl 3-amino-4,4,4-trichlorocrotonate (by the method of M. Coenen et al, J. Prakt. Chem. (4) 27. 239 (1965)) The procedure followed is analogous to the precursor for Preparation Example 8, with the difference that benzoylacetone is replaced by methyl acetoacetate. A crystalline solid having a melting point of 54° C. is obtained. (Lit.: 53°–54° C.), $^1$H NMR: —CH$_3$ 3.71 ppm (s, 3H), —CH=5.51 ppm (t, 1H), —NH$_2$ 6–7 ppm (broad, 2H).

b) Methyl 4,4,4-trichloroacetoacetate (by the method of C. Ringel, R. Mayer, J. Prakt. Chem. (4), 26, 333 (1964)) The procedure followed is as in Preparation Example 8, but with the difference that ethyl aminocrotonate is employed in place of benzoylbutenone. A substance is obtained having a boiling point of 60° C./0.1mm Hg; $^1$H NMR: —CH$_3$ 3.80 ppm (s, 3H), —CH$_2$-4.04 ppm (s, 2H). The product is present in the enol form to the extent of about 15% in CDCl$_3$ at room temperature, the enol form exhibiting the following NMR signals: —CH=7.29 ppm (s), —OH 12.45 ppm (s).

The initiator compounds containing aliphatic halogen which are described in the preparation examples are tested below in various radiation-sensitive mixtures according to the invention. However, the invention according to the description is not intended to be limited to these examples.

In these examples, "PW" stands for "parts by weight", and percentages indicate percent by weight, unless otherwise stated.

APPLICATION EXAMPLE 1

A coating solution was prepared from

17 PW of cresol-formaldehyde novolak having a softening range of 105°–120° C.,

5 PW of p-hydroxybenzaldehyde bis(phenoxyethyl) acetal, prepared analogously to Preparation Example 1, relating to benzaldehyde diphenoxyethyl acetal, of U.S. application Ser. No. 07/243,792 and 4 PW of O-2,2,2-trichloroethyl N-(4-hydroxyphenyl)-carbamate(Preparation Example 1) in 74 PW of propylene glycol monomethyl ether acetate.

The solution was spin-coated at 3000 rpm onto a silicon wafer which had been treated with an adhesion promoter (hexamethyldisilazane). After drying at 110° C. for 1 minute on a hot plate, a coating thickness of 1 μm was obtained. Imagewise irradiation was carried out using synchrotron radiation (BESSY, Berlin, 754 MeV) through a gold-on-silicon mask at a dose of 85 mJ/cm$^2$. The experimental arrangement can be found in A. Heuberger, "X-Ray Lithography", Microelectronic Engineering 3, 535–556 (1985). After exposure, the resist layer was kept at room temperature for 5 minutes. The material was developed using a 0.3N alkaline developer of the following composition:

5.3 PW of sodium metasilicate×9 H$_2$O, 3.4 PW of trisodium phosphate × 12 $H_2O$
0.3 PW of sodium dihydrogen phosphate and
191 PW of demineralized water.

After a development time of 50 s, a flaw-free image containing all details of the mask was obtained. The resist edges were not negatively eroded and exhibited angles of virtually 90° (in a photomicrograph from a scanning electron microscope (SEM)).

(BESSY, Berlin, 754 MeV, cf. Application Example 1), the developer solution used and the development time necessary to ensure good structure transfer. In all the outlined cases, it is possible to achieve good structure transfer with vertical edges without image fogging occurring.

TABLE I

| Applic. Example | Binder (72% by weight) | Initiator (13% by weight) | Cleavable compound (15% by weight) | Irradiation dose (mJ/cm$^2$) | Developer concentration (N) | Development time (sec) |
|---|---|---|---|---|---|---|
| 2 | Novolak resin with a glass trans. temp. of >110° C. | N-trichloro-acetyl-N'-hydroxypropyl-urea (PE2) | p-Methoxybenzaldehyde bis(phenoxyethyl) acetal | 85 | 0.2 | 30 |
| 3 | Novolak resin with a glass trans. temp. of >110° C. | O-phenyl N-trichloro-acetylcarbamate (PE3) | p-Methoxybenzaldehyde bis(phenoxyethyl) acetal | 85 | 0.4 | 95 |
| 4 | Novolak resin with a glass trans. temp. of >110° C. | Ethyl 4-bromo-3-oxobutyrate (PE4) | p-Methoxybenzaldehyde bis(phenoxyethyl) acetal | 70 | 0.3 | 120 |
| 5 | Novolak resin with a glass trans. temp. of >110° C. | Ethyl 2-chloro-3-oxobutyrate (PE5) | p-Methoxybenzaldehyde bis(phenoxyethyl) acetal | 30 | 0.3 | 135 |
| 6 | Novolak resin with a glass trans. temp. of >110° C. | 4-Trichloroacetyl-phenol (PE6) | p-Methoxybenzaldehyde bis(phenoxyethyl) acetal | 40 | 0.3 | 150 |
| 7 | Novolak resin with a glass trans. temp. of >110° C. | 1,1,1-Trichloro-acetylacetone (PE7) | p-Methoxybenzaldehyde bis(phenoxyethyl) acetal | 70 | 0.4 | 270 |
| 8 | Novolak resin with a glass trans. temp. of >110° C. | ω,ω,ω-Trichloro-benozylacetone (PE8) | p-Methoxybenzaldehyde bis(phenoxyethyl) acetal | 100 | 0.4 | |
| 9 | Novolak resin with a glass trans. temp. of >110° C. | Methyl 4,4,4-trichloroaceto-acetate (PE9) | p-Methoxybenzaldehyde bis(phenoxyethyl) acetal | 100 | 0.4 | 95 |
| 10 | Novolak resin with a glass trans. temp. of >110° C. | 1,1,1-Trichloro-acetylacetone (PE7) | Benzaldehyde bis(phenoxyethyl) acetal | 70 | 0.5 | 120 |
| 11 | Novolak resin with a glass trans. temp. of >110° C. | ω,ω,ω-Trichloro-benzoylacetone (PE8) | 3,4-Dimethoxy-benzaldehyde bis(n-butyloxyethyl)-acetate | 100 | 0.4 | 105 |
| 12 | Poly(p-hydroxy-styrene) $M_w$ = 26,000 | Methyl 4,4,4-trichloroaceto-acetate (PE9) | Tris(methyltriglycol) orthoformate | 100 | 0.3 | |
| 13 | Novolak resin with a glass trans. temp. of >110° C. | N-trichloro-acetyl-N'-3-hydroxypropyl-urea (PE2) | 1-Trimethylsilyloxy-styrene | 85 | 0.3 | 300 |

APPLICATION EXAMPLES 2 TO 15

Coating solutions with a solids content of 25% by weight in propylene glycol methyl ether acetate (®Dowanol PMA, Dow Chemical) were prepared analogously to Application Example 1.

Table I below shows the binder used in these Application Examples (novolak resin having a glass transition temperature of at least 110° C., in accordance with the earlier German Patent Application P 38 10 632.9 corresponding to U.S. application Ser. No. 07/330,174), the initiator compounds and the acid-cleavable compounds, in each case in their percentages by weight, based on the 25% by weight solids content of the coating solutions, and the irradiation dose of synchrotron radiation

APPLICATION EXAMPLES 14 AND 15 (COMPARISON EXAMPLES)

For comparison, coating solutions were prepared analogously to Appl. Examples 2 to 13, but using initiator compounds which, although in some cases containing aliphatic halogen, did not correspond to the initiator compounds used according to the invention, i.e., did not have groups in the molecule capable of producing a $pK_a$ value of less than 12. The coating solutions are shown in Table II. Here too, the coating components mentioned formed a solids content of 25% by weight, and the coating solution was prepared by adding 75% by weight of propylene glycol monomethyl ether acetate. The development solution used was the ®AZ developer from Application Examples 2 to 13, in the concentrations given below.

| Applic. Example | Binder (72% by weight) | Initiator (13% by weight) | Cleavable compound (15% by weight) | Irradiation dose (mJ/cm$^2$) |
| --- | --- | --- | --- | --- |
| 14 (C) | Novolak resin with a glass trans. temp. of >110° C. | Triphenyl-sulfonium hexafluoro-phosphate (sulf) | p-Methoxy-benzaldehyde bis(phenoxy-ethyl) acetate | 100 |
| 15 (C) | Novolak resin with a glass trans. temp. of >110° C. | 2,2-bis(4-chlorophenyl)-1,1,1-tri-chloroethane (DDT) | p-Methoxy-benzaldehyde bis(phenoxy-ethyl) acetate | 100 |

In Application Example 14, in spite of the use of concentrated developer with a normality of 0.6N, it was necessary to carry out the development for 360 sec. In Use Example 15, although development could be achieved after 270 sec using a 0.45N developer, significant scumming was observed, however, which could only be removed by developing with a 0.6N developer after 30 sec. The fine lines were undercut due to the long development time which was necessary and were finally rinsed away.

What is claimed is:

1. A positive radiation-sensitive mixture which comprises a compound which forms an acid under the action of high-energy radiation, and a compound which is cleavable by said acid, wherein the compound which forms an acid contains at least one aliphatically bound halogen atom and has a pK$_a$ value of less than about 12, or is converted into the compound having such a pK$_a$ value by said acid, and said acid-forming compound is present in the mixture in an amount from about 0.5 to 50% by weight based on the total weight of the non-volatile components of the mixture, and wherein said mixture is developable in aqueous-alkaline developer solutions.

2. A positive mixture as claimed in claim 1, wherein said halogen atom is a chlorine or bromine atom.

3. A positive mixture as claimed in claim 1, wherein said acid-forming compound has a pK$_a$ value of from 6 to 10.

4. A positive mixture as claimed in claim 1, wherein said acid-forming compound contains at least one functional group selected from the group consisting of a phenolic OH group, an aliphatic OH group having strongly electron-withdrawing substituents in the vicinity, an aromatic SH group, an aliphatic or aromatic sulfonamide group, an aliphatic or aromatic imide group, an N-acyl-substituted carbamate group, an N-acyl-substituted carbamide group or a CH-acidic group.

5. A positive mixture as claimed in claim 1, wherein said acid-forming compound contains a phenolic OH group, an imide group, an N-acyl-substituted carbamate group, an N-acyl-substituted carbamide group or a CH-acidic group.

6. A positive mixture as claimed in claim 1, wherein said halogen atom is bound to an sp$^3$-hybridized carbon atom.

7. A positive mixture as claimed in claim 1, wherein said acid-forming compound does not contain a hydrogen atom in the α-position to a carbon atom carrying chlorine or bromine substituents.

8. A positive mixture as claimed in claim 6, wherein said acid-forming compound contains a chlorinated or brominated acetyl group.

9. A positive mixture as claimed in claim 7, wherein said acid-forming compound contains a chlorinated or brominated acetyl group.

10. A positive mixture as claimed in claim 1, wherein said acid-forming compound contains a chlorinated or brominated tert.-butyl group.

11. A positive mixture as claimed in claim 1, wherein said acid-forming compound, on the α-carbon atom relative to the halogen-substituted carbon atom, does not carry any hydrogen atoms in the trans-position to the halogen atom.

12. A positive mixture as claimed in claim 1, wherein said acid-forming compound, in addition to at least one aliphatically bound halogen atom, also contains at least one aromatically bound halogen atom.

13. A positive mixture as claimed in claim 12, wherein said at least one aromatically bound halogen atom is in the o-position to a phenolic OH group.

14. A positive mixture as claimed in claim 1, wherein the substituent containing aliphatically bound bromine or chlorine is bound to an alkali-soluble polymer.

15. A positive mixture as claimed in claim 1, further comprising an alkali-soluble binder.

16. A positive mixture as claimed in claim 1, consisting essentially of the recited ingredients.

* * * * *